US008664073B2

(12) United States Patent
Lee et al.

(10) Patent No.: US 8,664,073 B2
(45) Date of Patent: Mar. 4, 2014

(54) METHOD FOR FABRICATING FIELD-EFFECT TRANSISTOR

(75) Inventors: Kun-Hsien Lee, Tainan (TW);
Cheng-Tung Huang, Kaohsiung (TW);
Wen-Han Hung, Kaohsiung (TW);
Shyh-Fann Ting, Kaohsiung County (TW); Li-Shian Jeng, Taitung (TW);
Meng-Yi Wu, Kaohsiung Hsien (TW);
Tzyy-Ming Cheng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 231 days.

(21) Appl. No.: 12/983,894

(22) Filed: Jan. 4, 2011

(65) Prior Publication Data
US 2012/0009745 A1    Jan. 12, 2012

Related U.S. Application Data

(63) Continuation-in-part of application No. 11/692,609, filed on Mar. 28, 2007, now Pat. No. 7,888,223.

(51) Int. Cl.
*H01L 21/8238*    (2006.01)
(52) U.S. Cl.
USPC ............. 438/305; 438/528; 257/E21.633; 257/E21.634
(58) Field of Classification Search
USPC .......... 257/206, 338, 369, 371, 377, E21.409, 257/E21.437, E21.633, E21.634; 438/199–233, 299–306, 528
See application file for complete search history.

(56) References Cited

U.S. PATENT DOCUMENTS

| 7,176,481 | B2 | 2/2007 | Chen | |
|---|---|---|---|---|
| 7,396,717 | B2 | 7/2008 | Wang | |
| 7,449,394 | B2 | 11/2008 | Akatsu | |
| 7,700,450 | B2 | 4/2010 | Lee | |
| 2004/0185633 | A1 | 9/2004 | Jain | |
| 2006/0003561 | A1 | 1/2006 | Goktepeli | |
| 2006/0234455 | A1 | 10/2006 | Chen | |
| 2006/0244080 | A1 | 11/2006 | Chen | |
| 2007/0037326 | A1 | 2/2007 | Chen | |
| 2007/0298557 | A1 | 12/2007 | Nieh | |
| 2008/0237661 | A1 | 10/2008 | Ranade | |
| 2008/0242031 | A1* | 10/2008 | Lee et al. | 438/285 |
| 2011/0147850 | A1* | 6/2011 | Nandakumar et al. | 257/368 |
| 2011/0147854 | A1* | 6/2011 | Nandakumar et al. | 257/382 |

FOREIGN PATENT DOCUMENTS

TW            200802625         1/2008

* cited by examiner

*Primary Examiner* — Steven J Fulk
*Assistant Examiner* — Eric Ward
(74) *Attorney, Agent, or Firm* — Winston Hsu; Scott Margo

(57) ABSTRACT

A method for fabricating complimentary metal-oxide-semiconductor field-effect transistor is disclosed. The method includes the steps of: (A) forming a first gate structure and a second gate structure on a substrate; (B) performing a first co-implantation process to define a first type source/drain extension region depth profile in the substrate adjacent to two sides of the first gate structure; (C) forming a first source/drain extension region in the substrate adjacent to the first gate structure; (D) performing a second co-implantation process to define a first pocket region depth profile in the substrate adjacent to two sides of the second gate structure; (E) performing a first pocket implantation process to form a first pocket region adjacent to two sides of the second gate structure.

19 Claims, 11 Drawing Sheets

METHOD FOR FABRICATING FIELD-EFFECT TRANSISTOR

CROSS REFERENCE TO RELATED APPLICATIONS

This application is a continuation-in-part of U.S. application Ser. No. 11/692,609, filed Mar. 28, 2007, and which is included herein by reference.

BACKGROUND OF THE INVENTION

1. Field of the Invention

The present invention relates to a fabrication method of integrated circuits. More particularly, the present invention relates to a fabrication method of a complimentary metal-oxide-semiconductor field-effect transistor (MOSFET).

2. Description of the Prior Art

The demand for high speed and low power consumption for logic devices can be accomplished by miniaturizing transistors. Scaling transistors to smaller dimensions can provide the logic devices with sufficiently high transistor saturation drain current and low gate capacitance for high speed and reduce leakage current for low power consumption.

However, as the size of a transistor is further reduced, various problems generated from the short-channel effects become significant. The ultra-shallow junction formation technique is one method used to resolve the short-channel effects. According to the traditional ultra-shallow junction formation technique, after the formation of a gate electrode, dopants are implanted with an appropriate amount of energy to two sides of the gate electrode, followed by performing rapid thermal annealing to generate the junction profile. Before the 90 nanometer (nm) generation, achieving the proper resistance and depth basically relies on lowering the implantation energy of dopants and diminishing the annealing time. However, after the arrival of the 65 and 45 nm generations, the conventional technique is no longer applicable. Co-implantation, laser annealing and high-angle ion implantation techniques are being investigated.

The concept of co-implantation technique is based on the fact that ion implantation causes interstitials injection. These interstitials are routes for transient enhanced diffusion of boron ions during spike annealing. The co-implantation schemes have shown to improve such an effect because the species implanted by co-implantation form bonds with the interstitials. Ultimately, the transient enhanced diffusion of boron ions and the formation of boron cluster caused by the interstitials are reduced.

Currently, carbon is the most commonly employed species in a single co-implantation process for increasing saturation voltage and for controlling the short-channel effects. However, the implanted carbon ions create abrupt junction depth profile. Ultimately, high electric field is resulted that in turns induces serious current leakage, especially at the side-wall-gate.

Fluorine ions are also of great interest as species for a single co-implantation process because both the depth and the abruptness of the junction profile can be better controlled. Ultimately, current leakage is mitigated. However, co-implantation with fluorine ions provides limited improvement on the saturation voltage. Hence, it is ineffective in improving the short-channel effects.

Another approach for enhancing the effectiveness of a device is by altering the mobility of the source/drain region. Since the traveling speed of electrons and holes in a silicon channel is limited, the application of this approach in transistors is also limited. The technology of employing a silicon germanium material for the source/drain region of a transistor has been proposed. This technology basically includes removing a portion of the silicon substrate pre-determined for forming the source/drain region, followed by employing the selective epitaxial technology to re-fill the substrate with silicon germanium. Comparing a source/drain region formed mainly with a silicon germanium material with that formed with a silicon material, germanium has a smaller electron effective mass and hole effective mass, the source/drain region formed with silicon germanium can enhance the mobility of electrons and holes. As a result, the effectiveness of the device is improved.

However, during the formation of silicon germanium, the epitaxy growth process is conducted at extremely high temperature. The heat provided for the formation of silicon germanium also causes the diffusion of boron, which ultimately leads to the short-channel effects.

SUMMARY OF THE INVENTION

The present invention is to provide a fabrication method of a semiconductor device, wherein the short-channel effects, caused by the size reduction of a device and an epitaxy growth process, can be mitigated.

According to a preferred embodiment of the present invention, a method for fabricating complimentary metal-oxide-semiconductor field-effect transistor is disclosed. The method includes the steps of: (A) forming a first gate structure and a second gate structure on a substrate; (B) performing a first co-implantation process to define a first type source/drain extension region depth profile in the substrate adjacent to two sides of the first gate structure; (C) forming a first source/drain extension region in the substrate adjacent to the first gate structure; (D) performing a second co-implantation process to define a first pocket region depth profile in the substrate adjacent to two sides of the second gate structure; (E) performing a first pocket implantation process to form a first pocket region adjacent to two sides of the second gate structure.

These and other objectives of the present invention will no doubt become obvious to those of ordinary skill in the art after reading the following detailed description of the preferred embodiment that is illustrated in the various figures and drawings.

DETAILED DESCRIPTION

According to the fabrication method of a semiconductor device of the present invention, preceding the implantation process for the formation of, for example, the source/drain extension region of a p-type channel field-effect (FET) transistor or the source/drain region, or the pocket region of a p-type channel field-effect transistor (FET) wherein the species in the ion implantation process, such as the boron ion implantation, are susceptible to diffusion or generation of the short-channel effects, a co-implantation process is performed to lower the transient enhanced diffusion effect of boron ions and the formation of boron cluster. Further, another co-implantation process is performed before or after performing the pocket implantation process of a p-type FET to improve the effectiveness of the device.

Figure 1:
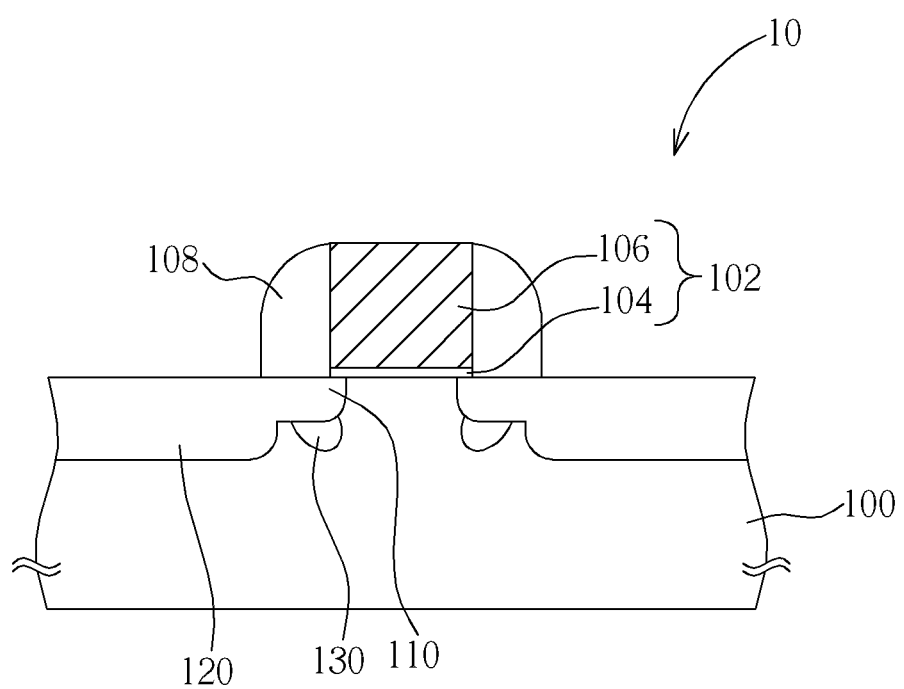
FIG. 1 is a schematic, cross-sectional view of a metal oxide semiconductor device.

FIG. 1 is a schematic, cross-sectional view of a metal oxide semiconductor device. In one embodiment, the metal oxide semiconductor device formed on the substrate 100 is a P-type channel field-effect transistor (FET) 10. The substrate 100 is a P-type substrate, for example, and an N-type well region (not shown) is formed in the P-type substrate. The gate structure 102 of the p-type channel FET 10 is constructed with a gate dielectric layer 104 and a gate conductive layer 106. The dopants in the source/drain extension region 110 beside two sides of the gate structure 102 include boron or $BF_3^+$. The dopants in the pocket region 130 below the source/drain extension region 110 include n-type dopants, such as phosphorous or arsenic, for suppressing the short-channel effects. Generally, the source/drain extension region 110 and the pocket region 130 are formed in the loop of the source/drain extension region during the semiconductor fabrication process. The dopants in the source/drain region 120 beside two sides of the spacer 108 include boron or $BF_3^+$. The source/drain region 120 is formed in the loop of the source/drain region.

In one embodiment of the invention, when performing the source/drain extension region loop, a first co-implantation process is performed before forming the source/drain extension region 110. The species implanted in the first co-implantation process can form bonds with the interstitials in the depth profile predetermined for forming the source/drain extension region 110. The transient enhanced diffusion of boron ions and the formation of boron cluster, caused by the interstitials, can be mitigated. The species implanted in the first co-implantation process include but not limited to carbon or fluorine. Further, the implantation energy is related to the dimension of the device. For example, the first co-implantation process includes employing implantation energy of about 1 KeV to 6 KeV, a dosage of about $1 \times 10^{14}$ to $2 \times 10^{15}$/cm$^2$ and an implantation angle of about 0 to 30 degrees. The source/drain region 120 at the periphery of the spacer 108 is doped with boron or $BF_3^+$.

Further, in the embodiments of the present invention, during the performance of the source/drain region loop, a second co-implantation process is performed before forming the source/drain region 120. The species implanted in the second co-implantation process can form bonds with the interstitials in the depth profile predetermined for forming the source/drain region 120. Thus, the transient enhanced diffusion of boron ions and the formation of boron cluster, induced by the interstitials, can be mitigated. The species implanted in the second co-implantation process include but not limited to carbon or fluorine. Further, the implantation energy is related to the dimension of the device. The implantation energy is slightly greater than the previous implantation energy used in the second co-implantation process for forming the source/drain extension region 110. For example, the second co-implantation process includes using implantation energy of about 1 KeV to 30 KeV, a dosage of about $1 \times 10^{14}$ to $2 \times 10^{15}$/cm$^2$ and an implantation angle of 0 degree.

The sequence of the process steps in a semiconductor fabrication process may vary. For example, depending on the sequence of the process steps, the pocket implantation may or may not belong to the source/drain extension region loop. In one embodiment, the pocket implantation process belongs to the source/drain extension region loop, wherein during the source/drain extension region loop, a third co-implantation process is performed to implant a species, for example, carbon or fluorine, to the pocket region 130 depth profile. In another embodiment, the pocket implantation process is not a part of the source/drain extension region loop, wherein the above third co-implantation process may be conducted during the source/drain extension region loop, or before or after performing the pocket implantation process. The implantation energy of the third co-implantation process is associated with the dimension of the device. For example, the third co-implantation process is performed with implantation energy of about 2 KeV to 20 KeV, an implanted dosage of about $1 \times 10^{14}$ to $2 \times 10^{15}$/cm$^2$ and an implantation angle of about 0 degree to 30 degrees. The species implanted in above first, second and third co-implantation processes may be the same or different.

Normally, a pre-amorphization implantation (PAI) process is incorporated with the co-implantation process. The pre-amorphization implantation process is mostly directed to silicon or germanium, in which appropriate amounts of energy and dosage can generate a destruction of the silicon lattice structure of the substrate to from an amorphous layer. The amorphized structure can lower the boron channeling and the transient enhanced diffusion (TED). During a typical manufacturing process, the pre-amorphization implantation process is directed to a germanium substrate because, comparing with a silicon substrate, less surface defects is generated and the low resistance of the shallow layer that is formed is lower.

During the fabrication of a metal oxide semiconductor device, the sequence of forming the source/drain extension region 110, the source/drain region 120 and the pocket region 130 can be altered according the demands and conditions of the manufacturing process. For example, the source/drain extension region 110 may form first, followed by forming the source/drain region and then the pocket region 130, or the source/drain extension region 110 may form first, followed by forming the pocket region 130 and then the source/drain region. To enhance the electron mobility of the source/drain region, a semiconductor compound is used and dopants for the source/drain region are introduced by in-situ doping during the epitaxy growth process of the semiconductor compound. On the other hand, the dopants for the source/drain region may introduce after the epitaxy growth process of the semiconductor compound. The following embodiments illustrate the various sequences of process steps of the fabrication method of the present invention.

FIGS. 2 to 9 are flow chart of exemplary process steps for fabricating a P-type channel field-effect transistor according to various embodiments of the present invention.

Figure 2:
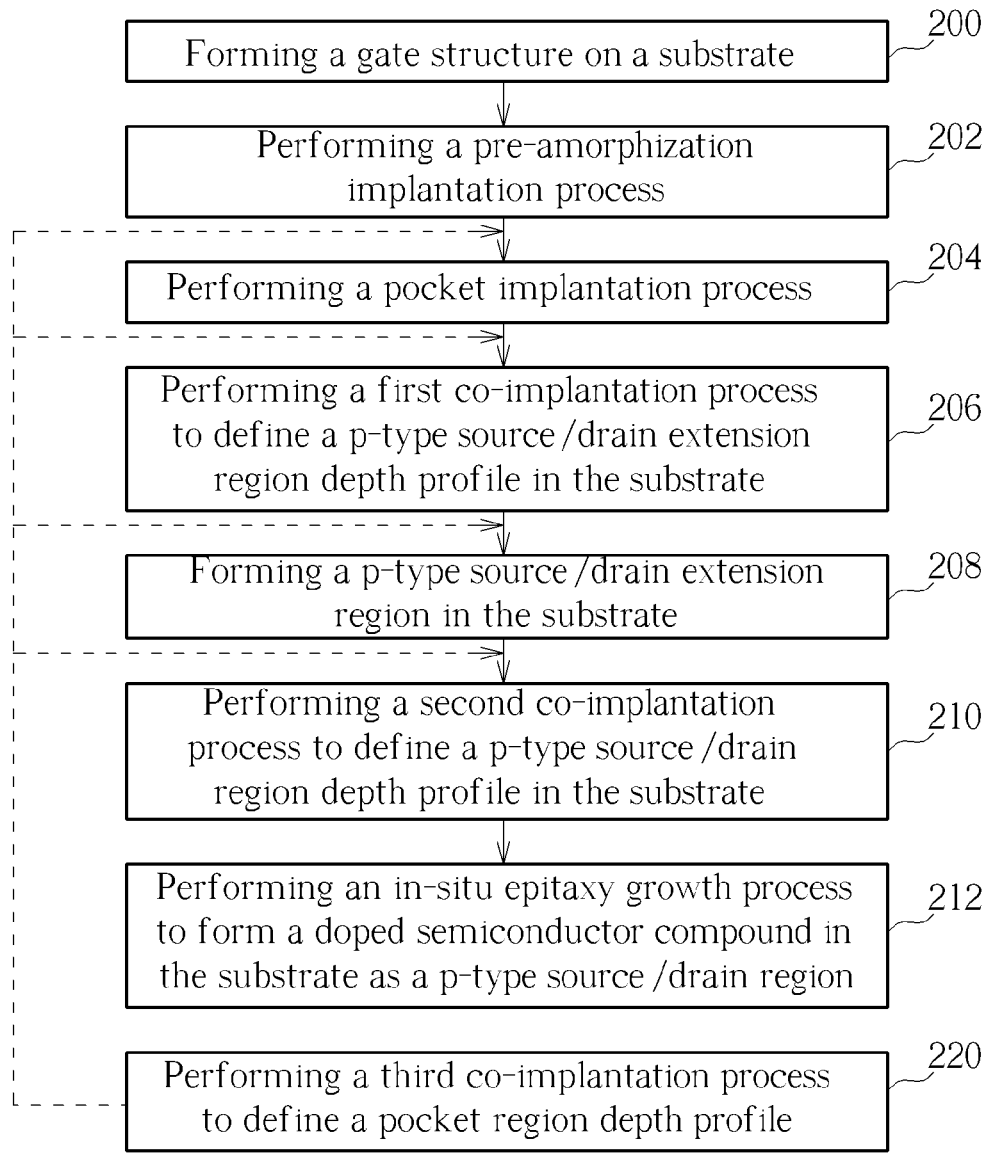
FIG. 2. is a flow chart of exemplary process steps for fabricating a P-type channel field-effect transistor according to a first embodiment of the present invention.

Referring to FIG. 2, a gate structure is formed on a substrate in step 200. After this, step 202 is performed, in which a pre-amorphization implantation process is performed to amorphize the substrate at two sides of the gate structure, using the gate structure as a mask. Thereafter, in step 204, a pocket implantation process is performed to form an n-type pocket region in the substrate. Continuing to step 206, a first co-implantation process is performed to define a p-type source/drain extension region depth profile in the substrate. Further, in step 208, a p-type source/drain extension region is formed in the substrate. Then, in step 210, a second co-implantation process is performed to define a p-type source/drain depth profile in the substrate. Thereafter, in step 212, an epitaxy growth process is performed to form a semiconductor compound in the substrate, wherein the semiconductor compound is doped in-situ to form a P-type source/drain region.

In one embodiment, the above fabrication method further includes performing a third co-implantation process in step 220 to define a pocket region depth profile. Step 220 can be performed between any two neighboring process steps among the steps 202 to 210.

Figure 3:
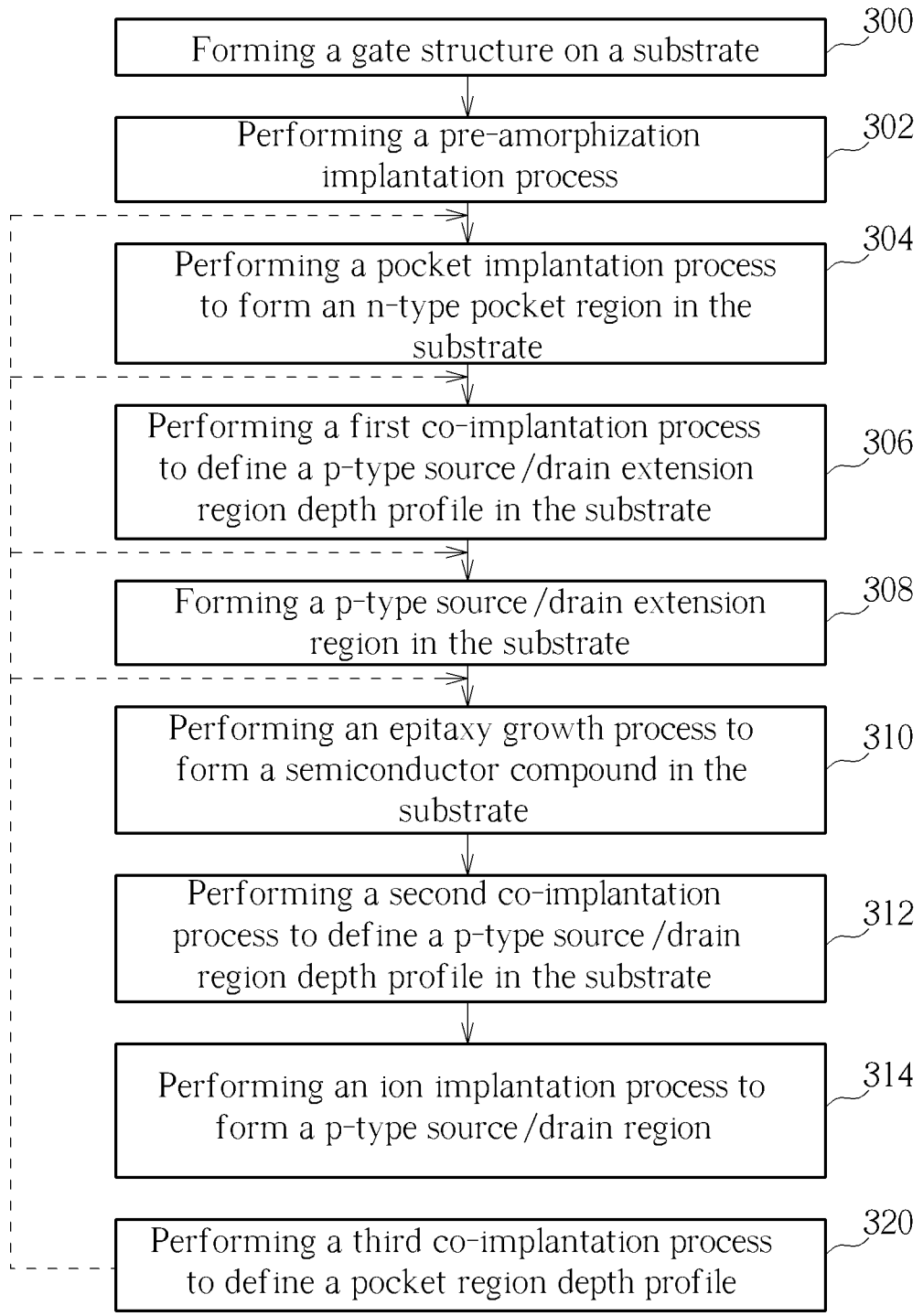
FIG. 3 is a flow chart of exemplary process steps for fabricating a P-type channel field-effect transistor according to a second embodiment of the present invention.

Referring to FIG. 3, a gate structure is formed on a substrate in step 300. After this, step 302 is performed, in which a pre-amorphization implantation process is performed to amorphize the substrate at two sides of the gate structure, using the gate structure as a mask. Thereafter, in step 304, a pocket implantation process is performed to form an n-type pocket region in the substrate. Continuing to step 306, a first co-implantation process is performed to define a p-type source/drain extension region depth profile in the substrate. Further, in step 308, a p-type source/drain extension region is formed in the substrate. Then, in step 310, an epitaxy growth process is performed to form a semiconductor compound in the substrate. Continuing to step 312, a second co-implantation process is performed to define a p-type source/drain depth profile in the substrate. Thereafter, in step 314, an ion implantation process is performed to form a P-type source/drain region.

In one embodiment, the above fabrication method further includes performing a third co-implantation process in step 320 to define a pocket region depth profile. Step 320 can be performed between any two neighboring process steps among the steps 302 to 310.

Figure 4:
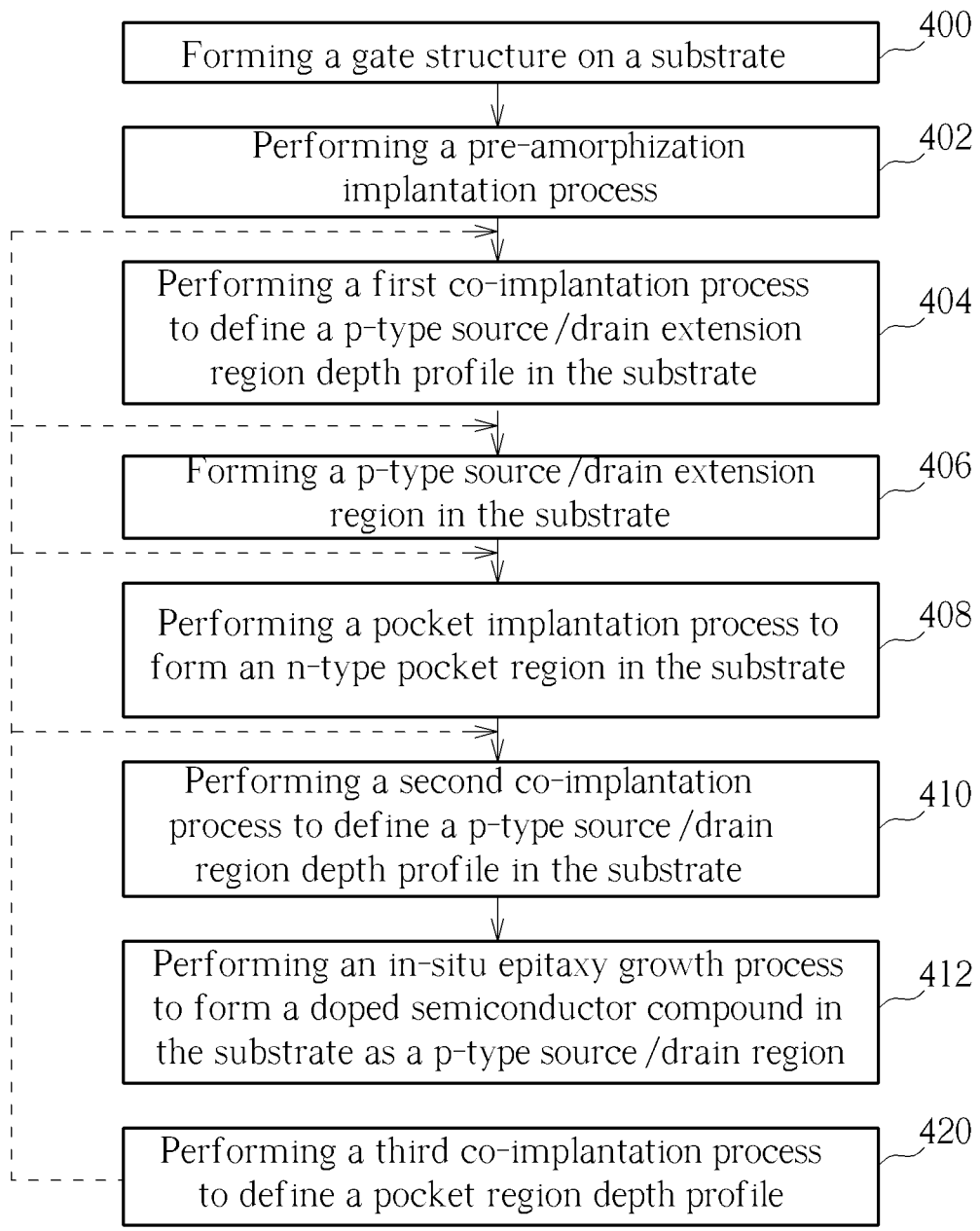
FIG. 4 is a flow chart of exemplary process steps for fabricating a P-type channel field-effect transistor according to a third embodiment of the present invention.

Referring to FIG. 4, a gate structure is formed on a substrate in step 400. After this, step 402 is performed, in which a pre-amorphization implantation process is performed to amorphize the substrate at two sides of the gate structure, using the gate structure as a mask. Thereafter, in step 404, a co-implantation process is performed to define a p-type source/drain extension region depth profile. Continuing to step 406, a p-type source/drain extension region is formed in the substrate. Then, in step 408, a pocket implantation process is performed to form an n-type pocket region in the substrate. Thereafter, in step 410, a second co-implantation process is performed to define a p-type source/drain region depth profile in the substrate. Then in step 412, an epitaxy growth process is performed to form a semiconductor compound in the substrate, and an in-situ doping is performed to form a p-type source/drain region.

Figure 5:
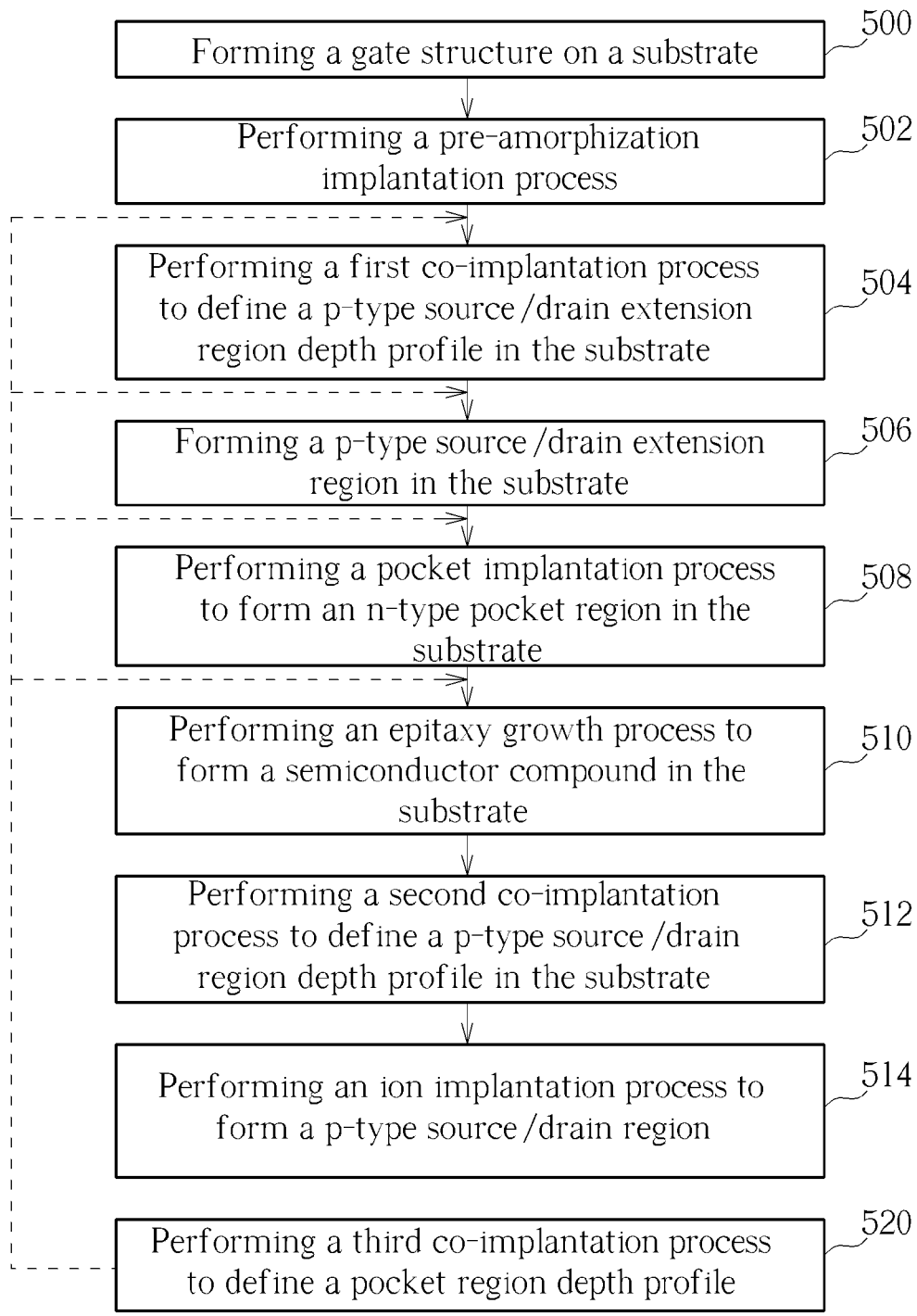
FIG. 5 is a flow chart of exemplary process steps for fabricating a P-type channel field-effect transistor according to a fourth embodiment of the present invention.

In one embodiment, the above fabrication method further includes step 420 of performing a third co-implantation process to define a pocket region depth profile. Step 420 can be conducted between any two neighboring steps among the steps 402 to 410. Referring to FIG. 5, in step 500, a gate structure is formed on a substrate. Then, in step 502, a pre-amorphization implantation process is performed to amorphize the substrate beside two sides of the gate structure. Thereafter, in step 504, a first co-implantation process is performed to define a p-type source/drain extension region depth profile. Continuing to step 506, a p-type extension region is formed in the substrate. After this, in step 508, a pocket implantation process is performed to form an n-type pocket region in the substrate. Then, in step 510, an epitaxy growth process is performed to form a semiconductor compound in the substrate. Continuing to step 512, a second co-implantation process is performed to define a p-type source/drain region depth profile to form a p-type source/drain region. Thereafter, in step 514, an ion implantation process is performed to form a p-type source/drain region.

In one embodiment, the above fabrication method may further include step 520 of performing a third co-implantation process to define the pocket region depth profile. Step 520 may be performed between any two neighboring process steps among the steps 502 to 510.

Figure 6:
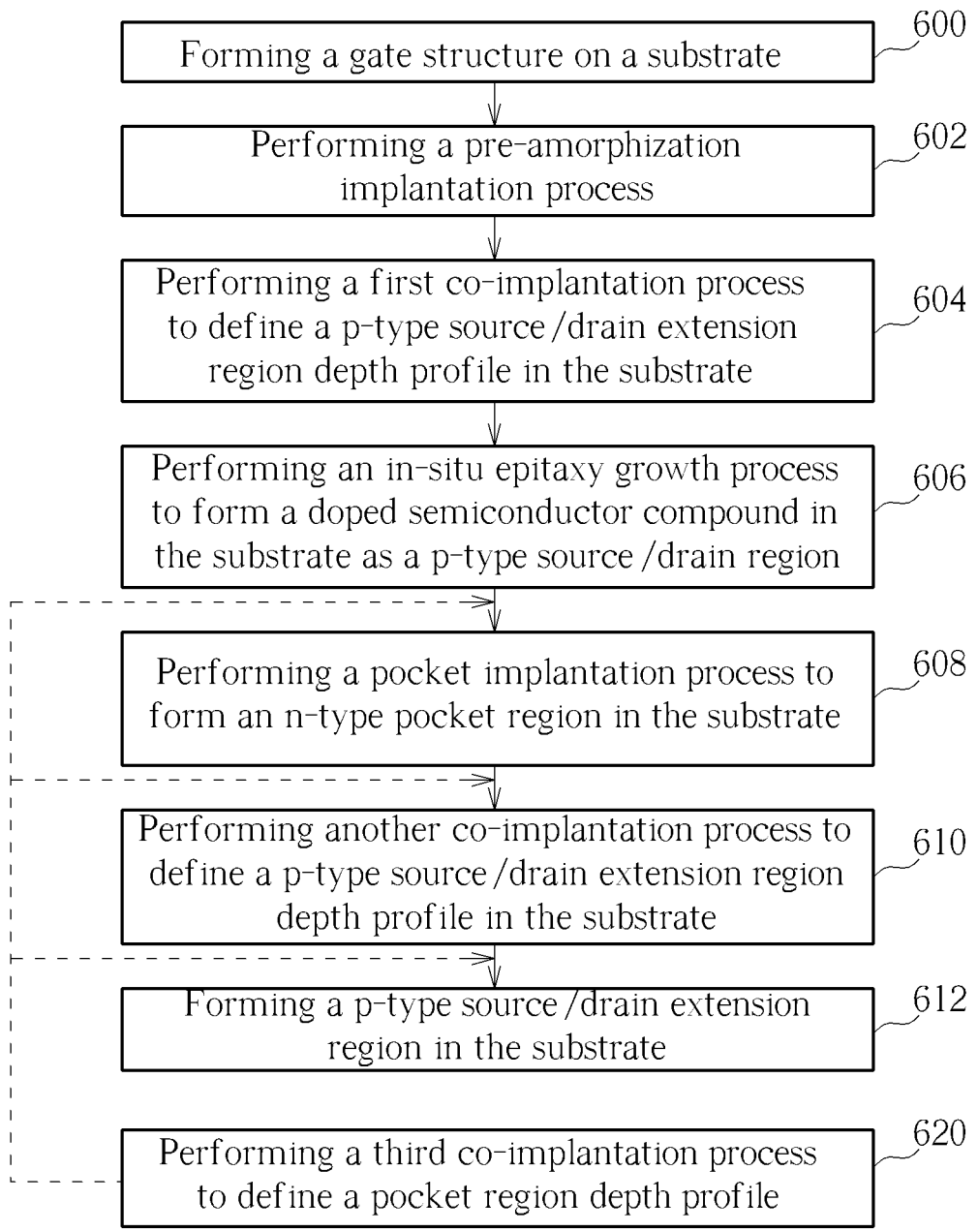
FIG. 6 is a flow chart of exemplary process steps for fabricating a P-type channel field-effect transistor according to a fifth embodiment of the present invention.

Referring to FIG. 6, a gate structure is formed on a substrate in step 600. After this, step 602 is performed, in which a pre-amorphization implantation process is performed to amorphize the substrate at two sides of the gate structure, using the gate structure as a mask. Thereafter, in step 604, a co-implantation process is performed to define a p-type source/drain extension region depth profile. Continuing to step 606, an epitaxy growth process is performed to form a semiconductor compound in the substrate, and an in-situ doping is performed to form a p-type source/drain region. In step 608, a pocket implantation process is performed to form an n-type pocket region in the substrate. Thereafter in step 610, another co-implantation process is performed to define a p-type source/drain region depth profile in the substrate. Then, in step 612, a p-type source/drain extension region is formed in the substrate.

In one embodiment, the above fabrication method may further include step 620 of performing a third co-implantation process to define the pocket region depth profile. Step 620 may be performed between any two neighboring process steps among the steps 606 to 612.

Figure 7:
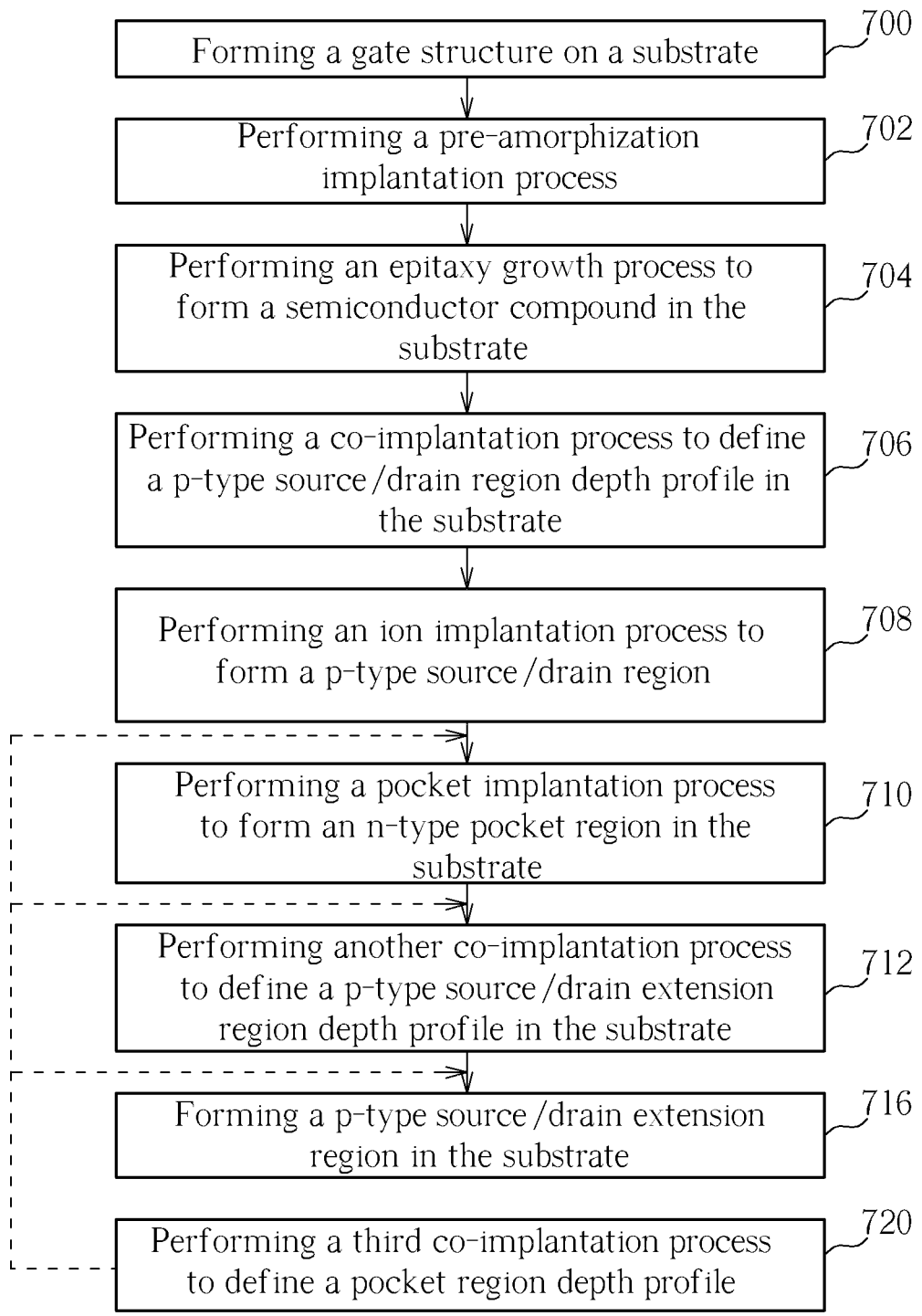
FIG. 7 is a flow chart of exemplary process steps for fabricating a P-type channel field-effect transistor according to a sixth embodiment of the present invention.

Referring to FIG. 7, a gate structure is formed on a substrate in step 700. After this, step 702 is performed, in which a pre-amorphization implantation process is performed to amorphize the substrate at two sides of the gate structure, using the gate structure as a mask. Thereafter, in step 704, an epitaxy growth process is performed to form a semiconductor compound in the substrate. Continuing to step 706, a co-implantation process is performed to define a p-type source/drain extension region depth profile in the substrate. Hereafter, in step 708, an ion implantation process is performed to form a p-type source/drain region. Then, in step 710, a pocket implantation process is performed to form an n-type pocket region in the substrate. Further in step 712, another co-implantation process is performed to define a p-type source/drain region depth profile in the substrate. Subsequently, in step 714, a p-type source/drain extension region is formed in the substrate.

In one embodiment, the above fabrication method may further include step 720 of performing a third co-implantation process to define the pocket region depth profile. Step 720 may be performed between any two neighboring process steps among the steps 708 to 714.

Figure 8:
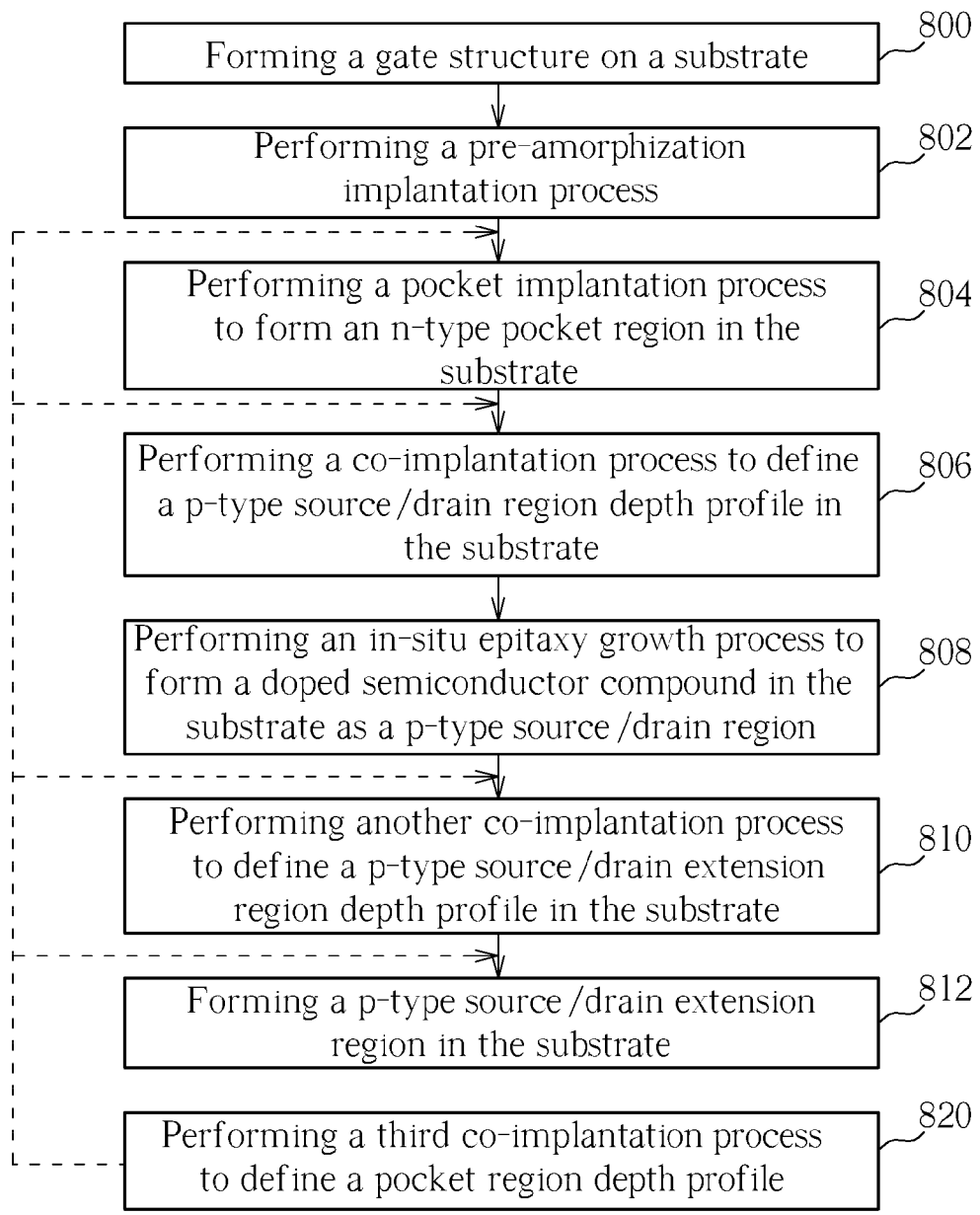
FIG. 8 is a flow chart of exemplary process steps for fabricating a P-type channel field-effect transistor according to a seventh embodiment of the present invention.

Referring to FIG. 8, a gate structure is formed on a substrate in step 800. After this, step 802 is performed, in which a pre-amorphization implantation process is performed to amorphize the substrate at two sides of the gate structure, using the gate structure as a mask. Thereafter, in step 804, a pocket implantation process is performed to form an n-type pocket region in the substrate. Continuing to step 806, a co-implantation process is performed to define a p-type source/drain extension region depth profile in the substrate. Further in step 808, an epitaxy growth process is performed to form a semiconductor compound in the substrate and an in-situ doping is performed to form a p-type source/drain region. Then, in step 810, another co-implantation process is performed to define a p-type source/drain region depth profile in the substrate. Hereafter, in step 812, a p-type source/drain extension region is formed in the substrate.

In one embodiment, the above fabrication method may further include step 820 of performing a third co-implantation process to define the pocket region depth profile. Step 820 may be performed between any two neighboring process steps among the steps 802 to 806 or among the steps 808 and 812, or after step 812.

Figure 9:
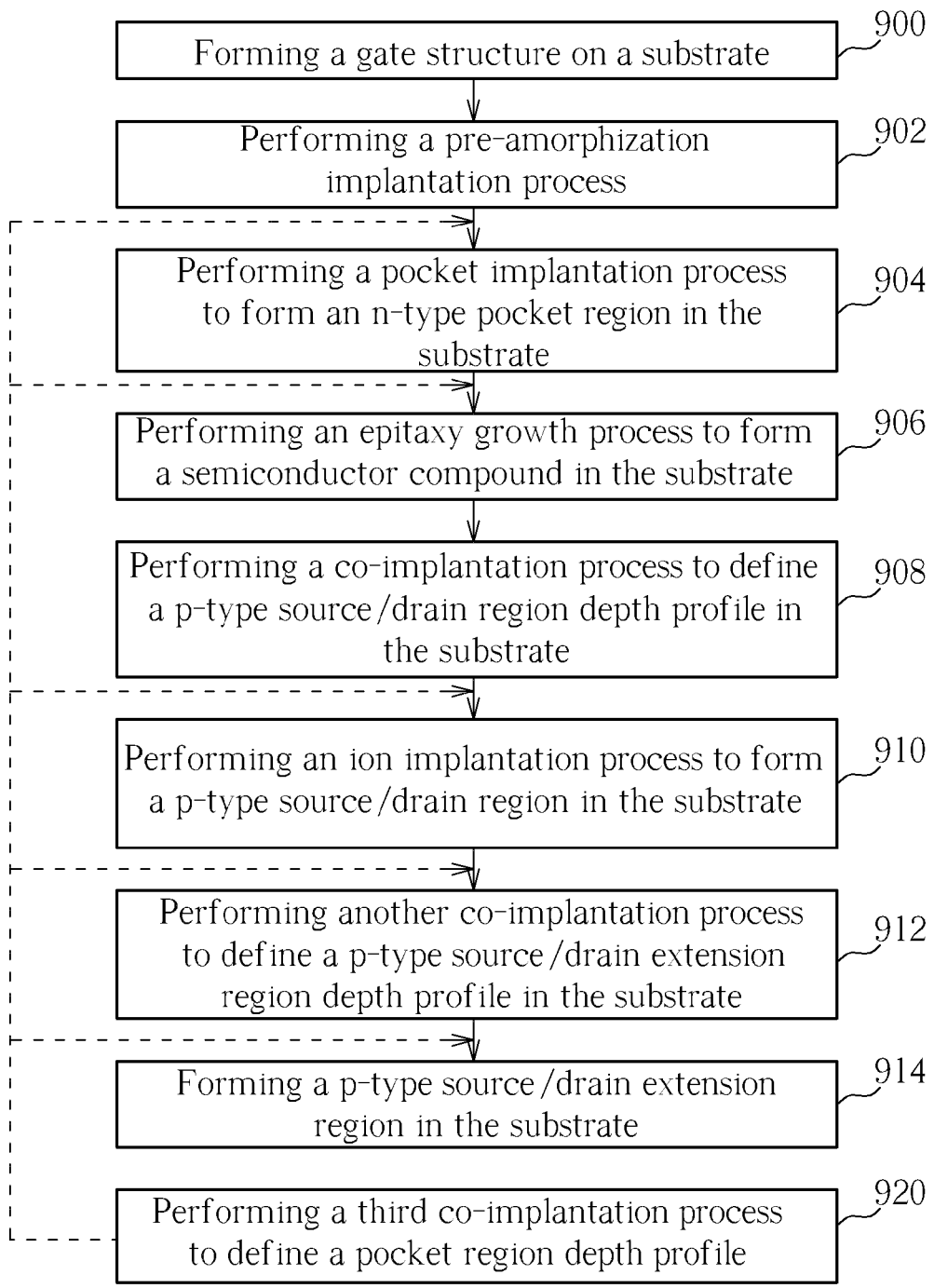
FIG. 9 is a flow chart of exemplary process steps for fabricating a P-type channel field-effect transistor according to an eighth embodiment of the present invention.

Referring to FIG. 9, a gate structure is formed on a substrate in step 900. After this, step 902 is performed, in which a pre-amorphization implantation process is performed to amorphize the substrate at two sides of the gate structure, using the gate structure as a mask. Thereafter, in step 904, a pocket implantation process is performed to form an n-type pocket region in the substrate. Continuing to step 906, an epitaxy growth process is performed to form a semiconductor compound in the substrate. Thereafter, in step 908, a co-implantation process is performed to define a p-type source/drain extension region depth profile in the substrate. Then, in step 910, an ion implantation process is performed to form a p-type source/drain region. Further in step 912, another co-implantation process is performed to define a p-type source/drain region depth profile in the substrate. Subsequently, in step 914, a p-type source/drain extension region is formed in the substrate.

In one embodiment, the above fabrication method may further include step 920 of performing a third co-implantation process to define the pocket region depth profile. Step 920 may be performed between any two neighboring process steps among the steps 902 to 906, or between any two neighboring process steps among the process steps 910 to 914. Although the embodiments herein refer to p-type channel field-effect transistors, it is to be understood that the present invention is also applicable to n-type field-effect transistors. Further, the source/drain region of an n-type field-effect transistor may constitute with a material including silicon carbide, which may form by an epitaxy growth process.

Figure 10:
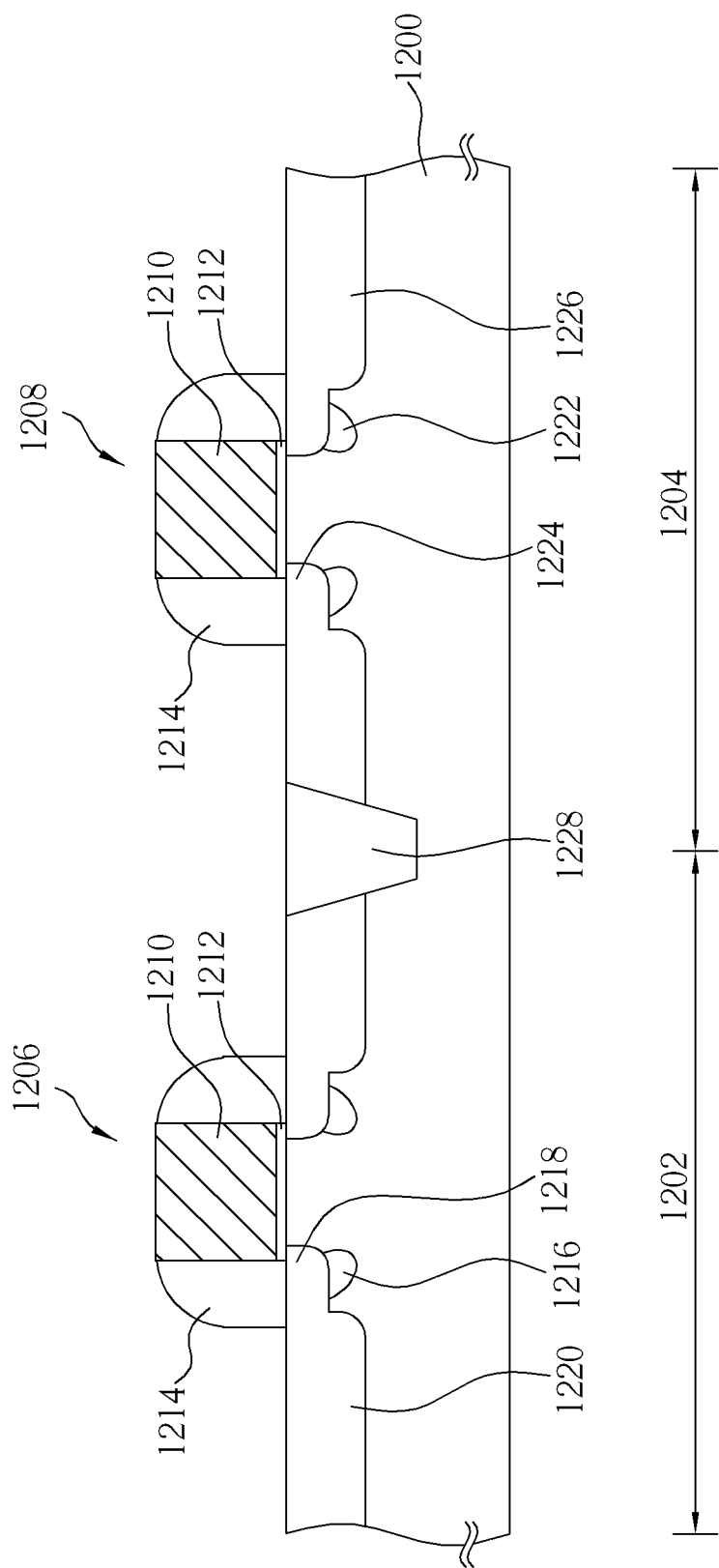
FIG. 10 illustrates a cross-sectional view of a complimentary metal oxide semiconductor (CMOS) device according to a preferred embodiment of the present invention.

Referring to FIG. 10, which illustrates a cross-sectional view of a complimentary metal oxide semiconductor (CMOS) device according to a preferred embodiment of the present invention. In this embodiment, a substrate 1200 is first provided and a NMOS region 1202 and a PMOS region 1204 are defined on the substrate 1200, in which the NMOS region 1202 and the PMOS region 1204 could be separated by a shallow trench isolation (STI) 1228. A first gate structure 1206 and a second gate structure 1208 are constructed with a gate dielectric layer 1210 and a gate conductive layer 1212 on the NMOS region 1202 and the PMOS region 1204, and a spacer 1214 is formed on the sidewall of the first gate structure 1206 and the second gate structure 1208 respectively. In the NMOS region 1202, at least a pocket region 1216 and a source/drain extension region 1218 are formed in the substrate 1200 adjacent to two sides of the first gate structure 1206, and a source/drain region 1220 is formed in the substrate 1200 adjacent to two sides of the spacer 1214. The dopants in the pocket region 1216 of the NMOS region 1202 include p-type dopants such as boron or $BF_3^+$ while the dopants in the source/drain extension region 1218 and the source/drain region 1220 include n-type dopants such as phosphorous or arsenic.

In the PMOS region 1204, a pocket region 1222 and a source/drain extension region 1224 are formed in the substrate 1200 adjacent to two sides of the second gate structure 1208, and a source/drain region 1226 is formed in the substrate 1200 adjacent to two sides of the spacer 1214. The dopants in the pocket region 1222 of the PMOS region 1204 include n-type dopants such as phosphorous or arsenic while the dopants in the source/drain extension region 1224 and the source/drain region 1226 include p-type dopants such as boron or $BF_3^+$.

Figure 11:
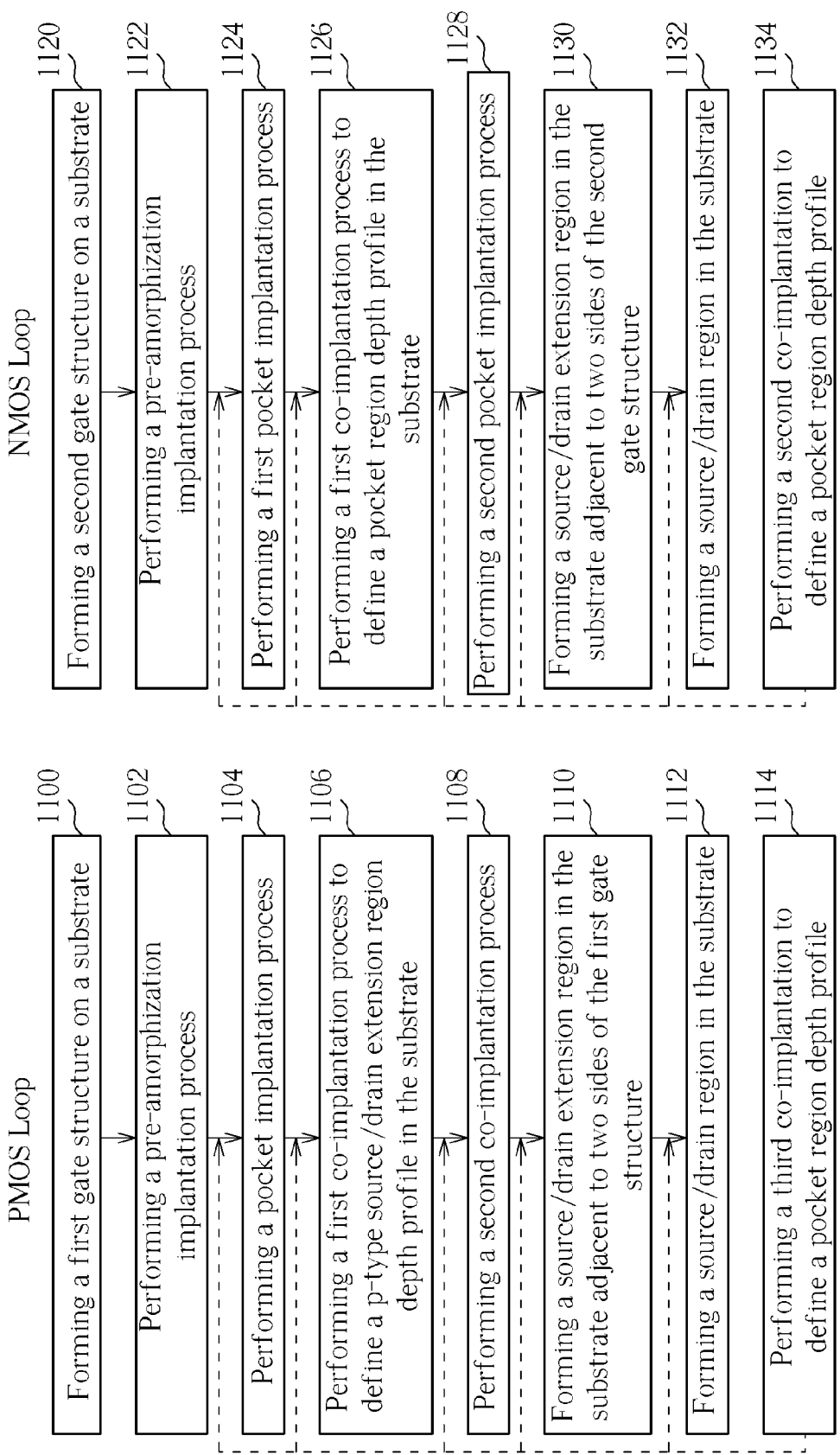
FIG. 11 illustrates a flowchart of exemplary process steps for fabricating a CMOS device according to a preferred embodiment of the present invention.

Referring to FIG. 11, which illustrates a flowchart of exemplary process steps for fabricating the CMOS device shown in FIG. 10 according to a preferred embodiment of the present invention.

Preferably, the fabrication of a PMOS transistor from the CMOS device is illustrated on the left side of the flowchart while the loop for fabricating a NMOS transistor from the CMOS device is shown on the right side of the flowchart. First, the fabrication loop for the PMOS transistor of the CMOS device is summarized below. Despite the following order reflects a preferred sequence of the fabrication, the order of the steps can be altered according to the demand and condition of the fabrication process.

Step 1100: A first gate structure is formed on the PMOS region of the substrate, in which the first gate structure includes a gate dielectric layer and a gate conductive layer.

Step 1102: Performing a pre-amorphization implantation process by implanting silicon or germanium to amorphize the substrate adjacent to two sides of the first gate structure.

Step 1104: Performing a pocket implantation process to form a n-type pocket region in the substrate. The species implanted in the pocket implantation process preferably includes n-type dopants such as phosphorous or arsenic.

Step 1106: Performing a first co-implantation process to define a p-type source/drain extension region depth profile in the substrate. Preferably, the species implanted in the first co-implantation process can form bonds with the interstitials in the depth profile predetermined for forming a source/drain extension region thereafter. The transient enhanced diffusion of boron ions and the formation of boron cluster, caused by the interstitials, can therefore be mitigated. The species implanted in the first co-implantation process include but not limited to carbon or fluorine.

Step 1108: Performing a second co-implantation process to further define the p-type source/drain extension depth profile. Similar to the first co-implantation process, the species implanted in the second co-implantation process include but not limited to carbon or fluorine.

Step 1110: Forming a source/drain extension region in the substrate adjacent to two sides of the first gate structure by implanting p-type dopants such as boron or $BF_3^+$.

Step 1112: Forming a source/drain region in the substrate by implanting p-type dopants such as boron or $BF_3^+$. Similar to the aforementioned embodiments, the formation of the source/drain region could be accomplished by two different approaches. First, an epitaxy growth process could be performed to form a semiconductor compound, and an ion implantation process is carried out to form the source/drain region. Alternatively, an in-situ doping epitaxy growth process could be performed to form a doped semiconductor compound for serving as the source/drain region.

Next, the fabrication loop for the NMOS transistor of the CMOS device is summarized below. Despite the following order reflects a preferred sequence of the fabrication, the order of the steps can also be altered according to the demand and condition of the fabrication process.

Step 1120: A second gate structure is formed on the NMOS region of the substrate, in which the second gate structure includes a gate dielectric layer and a gate conductive layer.

Step 1122: Performing a pre-amorphization implantation process by implanting silicon or germanium to amorphize the substrate adjacent to two sides of the second gate structure.

Step 1124: Performing a first pocket implantation process to form a first pocket region in the substrate. The species implanted in the first pocket implantation process preferably includes nitrogen.

Step 1126: Performing a first co-implantation process to define a pocket region depth profile in the substrate. Preferably, the species implanted in the co-implantation process can form bonds with the interstitials in the depth profile predetermined for forming another pocket region thereafter. The transient enhanced diffusion of boron ions and the formation of boron cluster in the second pocket region, caused by the interstitials, can therefore be mitigated. The species implanted in the co-implantation process include but not limited to carbon or fluorine.

Step 1128: Performing a second pocket implantation process to form a second pocket region in the substrate. The species in the second pocket implantation process preferably includes boron or $BF_3^+$.

Step 1130: Forming a source/drain extension region in the substrate adjacent to two sides of the second gate structure by implanting n-type dopants such as phosphorous or arsenic.

Step 1132: Forming a source/drain region in the substrate by implanting n-type dopants such as phosphorous or arsenic. Similar to the aforementioned embodiment of using silicon germanium as source/drain region for the PMOS transistor, the source/drain region of the NMOS transistor may be formed with material such as silicon carbide through epitaxy growth process.

It should be noted that the aforementioned PMOS loop and the NMOS loop is not limited to a particular order. For instance, the PMOS loop could be carried out before the NMOS loop or the NMOS loop could be carried out before the PMOS loop, which are all within the scope of the present invention.

Also, despite the pocket regions in the PMOS loop and NMOS loop are formed before the formation of the source/drain extension regions, the order of forming the pocket region and the source/drain extension region could be reversed. For instance, the n-type pocket region in the PMOS loop could be formed after the p-type source/drain extension region, whereas the p-type pocket region in the NMOS loop could be formed after the n-type source drain extension region, which are all within the scope of the present invention. It should be noted that even through the order for forming the pocket region and the source/drain extension region is reversed, both the pocket region and the source/drain extension region are preferably formed before the source/drain region.

Moreover, in addition to the two co-implantation processes addressed for the PMOS transistor loop and the single co-implantation process carried out in the NMOS transistor loop, the above fabrication method may further include step 1114 and/or step 1134 of performing an additional co-implantation process to define the pocket region depth profile. For instance, step 1114 and/or step 1134 may be performed between any two neighboring process steps among the steps 1100 to 1112, or between any two neighboring process steps among the process steps 1120 to 1132, which are all within the scope of the present invention.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a complimentary metal-oxide-semiconductor field-effect transistor (MOSFET), comprising:
    (A) forming a PMOS gate structure and an NMOS gate structure on a substrate;
    (B) performing a first co-implantation process to define a p-type source/drain extension region depth profile in the substrate adjacent to two sides of the PMOS gate structure;
    (C) forming a p-type source/drain extension region with p-type species in the substrate adjacent to the PMOS gate structure;
    (D) performing a second co-implantation process to define a first pocket region depth profile in the substrate adjacent to two sides of the NMOS gate structure;
    (E) performing a first pocket implantation process with p-type species to form a first pocket region adjacent to two sides of the NMOS gate structure;
    (M) performing a second pocket implantation process to form a second pocket region adjacent to two sides of the NMOS gate structure before the step (D);
    (N) performing a second pre-amorphization implantation process to amorphize the substrate adjacent to two sides of the NMOS gate structure before the step (M);
    (O) forming an n-type source/drain region in the substrate after the step (E);
    (P) forming an n-type source/drain extension region in the substrate adjacent to the NMOS gate structure before the step (O); and
    performing sequentially the step (E), the step (P), and the step (O).

2. The method of claim 1, wherein a species implanted in the first co-implantation process comprises carbon or fluorine.

3. The method of claim 1, wherein a species implanted in the second co-implantation process comprises carbon or fluorine.

4. The method of claim 1, further comprising (F) performing a first pre-amorphization implantation process to amorphize the substrate adjacent to two sides of the PMOS gate structure before the step (B).

5. The method of claim 4, further comprising (G) performing a third pocket implantation process to form a third pocket region adjacent to two sides of the PMOS gate structure before the step (B).

6. The method of claim 5, further comprising performing sequentially the step (G) and the step (C).

7. The method of claim 5, further comprising performing sequentially the step (C) and the step (G).

8. The method of claim 5, wherein a species implanted in the third pocket implantation process comprises phosphorous or arsenic.

9. The method of claim 5, further comprising (H) forming a p-type source/drain region in the substrate after the step (C).

10. The method of claim 9, wherein the step (H) comprises:
   (1) performing an epitaxy growth process to form a semiconductor compound; and
   (J) performing an ion implantation process to form the p-type source/drain region.

11. The method of claim 9, wherein the step (H) comprises:
   (K) performing an in-situ doping epitaxy growth process to form a doped semiconductor compound serving as the p-type source/drain region.

12. The method of claim 9, wherein a species implanted in the p-type source/drain extension region, the p-type source/drain region, and the first pocket region comprises boron or $BF_3^+$.

13. The method of claim 9, further comprising performing a third co-implantation process between the step (F) and the step (G), the step (G) and the step (C), or the step (C) and the step (H).

14. The method of claim 13, wherein a species implanted in the third co-implantation process comprises carbon or fluorine.

15. The method of claim 1, further comprising
   (L) performing a fourth co-implantation process between the step (B) and the step (C).

16. The method of claim 15, wherein a species implanted in the fourth co-implantation process comprises carbon or fluorine.

17. The method of claim 1, wherein the second pocket implantation process comprises implanting nitrogen into the substrate for forming the second pocket region.

18. The method of claim 1, further comprising performing a fifth co-implantation process between the step (N) and the step (M), the step (M) and the step (E), the step (E) and the step (P), or the step (P) and the step (O).

19. The method of claim 1, further comprising:
   (G) performing a third pocket implantation process to form a third pocket region adjacent to two sides of the PMOS gate structure; and
   (L) performing a fourth co-implantation process, wherein the step (G), the step (B), the step (L) and the step (C) are performed sequentially.

* * * * *